(12) United States Patent
Ahn et al.

(10) Patent No.: US 9,653,311 B1
(45) Date of Patent: May 16, 2017

(54) 3D NAND STAIRCASE CD FABRICATION UTILIZING RUTHENIUM MATERIAL

(71) Applicant: Applied Materials, Inc., Santa Clara, CA (US)

(72) Inventors: Seul Ki Ahn, Santa Clara, CA (US); Seung-Young Son, Santa Clara, CA (US); Gill Yong Lee, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/154,599

(22) Filed: May 13, 2016

(51) Int. Cl.
    *H01L 21/4763* (2006.01)
    *H01L 21/3065* (2006.01)
    *H01L 21/308* (2006.01)

(52) U.S. Cl.
    CPC ...... *H01L 21/3065* (2013.01); *H01L 21/3085* (2013.01); *H01L 21/3086* (2013.01)

(58) Field of Classification Search
None
See application file for complete search history.

(56) References Cited

U.S. PATENT DOCUMENTS

| | | | |
|---|---|---|---|
| 5,236,550 A | | 8/1993 | Abt et al. |
| 5,407,855 A | * | 4/1995 | Maniar ............... H01L 23/5226 257/E21.008 |
| 9,230,983 B1 | * | 1/2016 | Sharangpani ..... H01L 27/11524 |
| 2009/0078676 A1 | * | 3/2009 | Yamada .................... C23F 4/00 216/47 |
| 2015/0079501 A1 | * | 3/2015 | Shoki ........................ G03F 1/24 430/5 |
| 2016/0149002 A1 | * | 5/2016 | Sharangpani ....... H01L 29/1054 257/314 |
| 2016/0300848 A1 | * | 10/2016 | Pachamuthu ......... H01L 21/768 |

OTHER PUBLICATIONS

"The Effect of CF4 Addition on Ru Etching with Inductively Coupled Plasma", Journal of the Korean Physical Society, vol. 42, Feb. 2003, pp. S829S832.
"Etching technique for ruthenium with a high etch rate and high selectivity using ozone Gas", Journal of Vacuum Science & Technology B 19, 2133 (2001).

* cited by examiner

*Primary Examiner* — Angel Roman
(74) *Attorney, Agent, or Firm* — Patterson + Sheridan, LLP

(57) ABSTRACT

Embodiments of the present disclosure provide an apparatus and methods for forming stair-like structures with accurate profiles and dimension control for manufacturing three dimensional (3D) stacked semiconductor devices. In one embodiment, a method of forming stair-like structures on a substrate includes forming a film stack including a dielectric layer and a ruthenium containing material, and etching the ruthenium containing material in the film stack exposed by a patterned photoresist layer utilizing a first etching gas mixture comprising an oxygen containing gas.

19 Claims, 9 Drawing Sheets

TO FIG. 6D

3D NAND STAIRCASE CD FABRICATION UTILIZING RUTHENIUM MATERIAL

BACKGROUND

Field

Embodiments of the present disclosure generally relate to methods of manufacturing a vertical type semiconductor device, and more particularly to methods of manufacturing a vertical type semiconductor device with stair-like structures for semiconductor manufacturing applications.

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

A patterned mask, such as a photoresist layer, is commonly used in forming structures, such as gate structure, shallow trench isolation (STI), bite lines and the like, on a substrate by etching process. The patterned mask is conventionally fabricated by using a lithographic process to optically transfer a pattern having the desired critical dimensions to a layer of photoresist. The photoresist layer is then developed to remove undesired portion of the photoresist, thereby creating openings in the remaining photoresist.

In order to enable fabrication of next generation devices and structures, three dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three dimensional (3D) stacking of semiconductor chips reduces wire lengths and keeps wiring delay low. In manufacturing three dimensional (3D) stacking of semiconductor chips, stair-like structures are often utilized to allow multiple interconnection structures to be disposed thereon, forming high-density of vertical transistor devices.

When forming stair-like structures in a film stack disposed on a substrate, an etching process along with a photoresist trimming process are repeatedly performed to etch the film stack with sequentially trimmed photoresist layer as etching masks. In an exemplary embodiment depicted in FIG. 1A, a trimmed photoresist layer (not shown) may serve as an etching mask layer to transfer structures onto a film stack 120 disposed on a substrate 104 to form stair-like structures 110 on the substrate 104 for forming a semiconductor device 100. The film stack 120 typically includes alternating layers of layers 120a, 120b (shown as $120a_1$, $120b_1$, $120a_2$, $120b_2$, ..., $120a_5$, $120b_5$), either conductive layers or insulating layers, as shown in FIG. 1B. During etching, the photoresist layer is sequentially trimmed to different dimensions while serving as an etch mask to form stair-like structures 110 having different widths.

During manufacturing of the stair-like structures 110 on the substrate 104, each stair formed in the stair-like structures 110 has its intended width to allow channels 125 to be formed thereon, as sown in FIGS. 1A and 1B. In some embodiment where a higher device performance is required, different materials of the alternating layers 120a, 120b may be tested or tried. For example, when a higher electric mobility of the device performance is required, a metal conductive material is often utilized in the stair-like structures 110. In one example, a second layer 120b (shown as $120b_1$, ..., $120b_5$ in FIG. 1B) of the alternating layers 120a, 120b may be removed from the stair-like structures 110 and replaced with a metal containing layer 150, as depicted in FIG. 1C, to improve the electrical performance of the device 100. However, when removing the original second layer 120b (shown as $120b_1$, ..., $120b_5$ in FIG. 1B) from the stair-like structures 110 to replace or insert with the metal containing layer 150, as depicted in FIG. 1C, residuals and/or surface roughness 152 are often created at the interface 130 between the metal containing layer 150 and the original first layer 120a (shown as $120a_1$, ..., $120a_5$ in FIGS. 1B and 1C), thus creating poor electrical contact at the interface 130, eventually leading to device failure or electrical performance degradation.

Thus, there is a need for improved methods and apparatus for forming stair-like structures with accurate profiles and dimension control for three dimensional (3D) stacking of semiconductor devices.

SUMMARY

Embodiments of the present disclosure provide an apparatus and methods for forming stair-like structures with accurate profiles and dimension control for manufacturing three dimensional (3D) stacked semiconductor devices. In one embodiment, a method of forming stair-like structures on a substrate includes forming a film stack including a dielectric layer and a ruthenium containing material, and etching the ruthenium containing material in the film stack exposed by a patterned photoresist layer utilizing a first etching gas mixture comprising an oxygen containing gas.

In another example, a method of forming stair-like structures on a substrate includes forming a film stack including alternating first and second layers, selectively removing the second layers from the film stack, leaving spaces between the first layers, forming metal conductive layers comprising a ruthenium containing material in the spaces and in contact with the first layers, and etching the metal conductive layers in the film stack exposed by a patterned photoresist layer utilizing a first etching gas mixture comprising oxygen containing gas.

In yet another example, a method of forming stair-like structures on a substrate includes forming a film stack including alternating dielectric layers and ruthenium containing layers, etching the ruthenium containing layers in the film stack exposed by a patterned photoresist layer utilizing a first etching gas mixture comprising oxygen containing gas until a first surface of the dielectric layers is exposed, trimming the patterned photoresist layer from a first dimension to a second dimension until a second surface of the dielectric layers is exposed, and etching the dielectric layers from the second surface exposed by the trimmed patterned photoresist layer by a second etching gas mixture.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

The present disclosure provides methods for forming stair-like structures on a substrate for three dimensional (3D) stacking of semiconductor devices. In one example, precise dimension control, accurate feature transfer, superior electrical performance and good process control during manufacturing may be obtained by utilizing a metal containing material in the film stack along with a selective patterning process to form the stair-like structures on the substrate. In one example, a method of forming stair-like structures for three dimensional (3D) stacked semiconductor devices may utilizes a metal conductive material, such as a ruthenium (Ru) metal containing material, in the film structure along with a selective etching process to etching the dielectric layer and the ruthenium (Ru) metal containing material in the film structure with high selectively so as to maintain good control of the interface profile and topography.

Figure 1A:
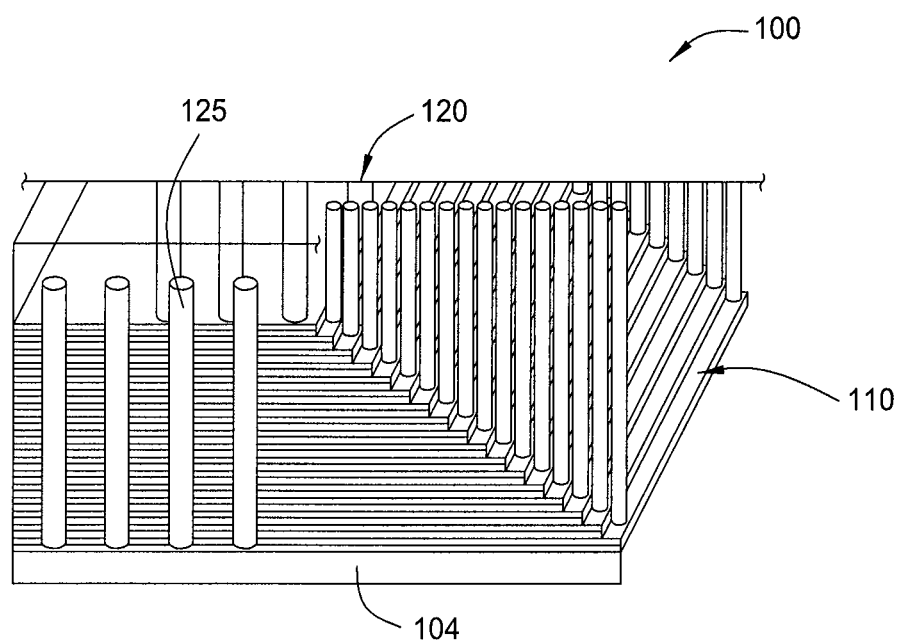
FIG. 1A depicts a schematic cross-sectional view of conventional stair-like structures formed on a substrate.
Figure 1B:
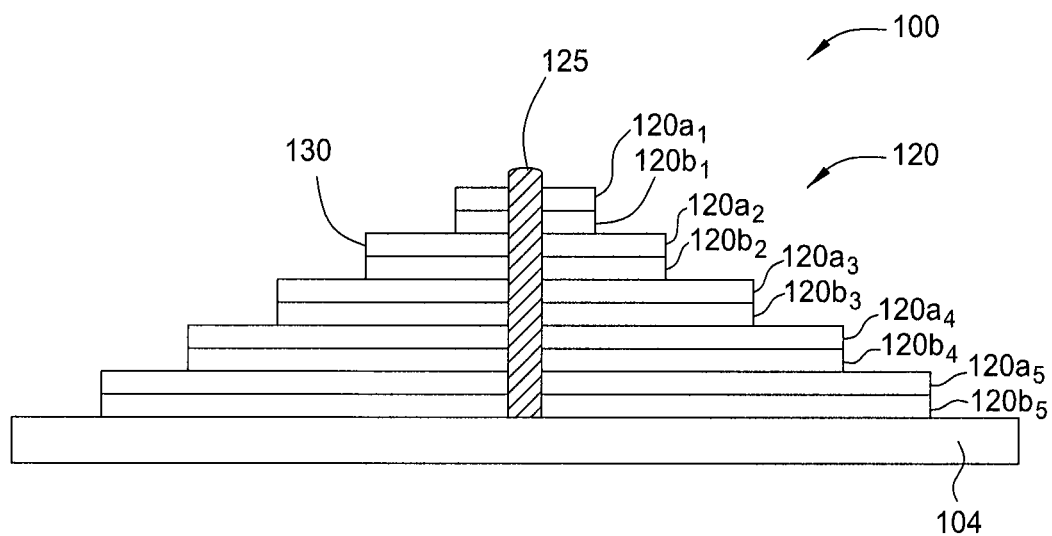
FIGS. 1B and 1C depict a portion of a schematic cross-sectional view of the conventional stair-like structures formed on the substrate of FIG. 1A.
Figure 1C:
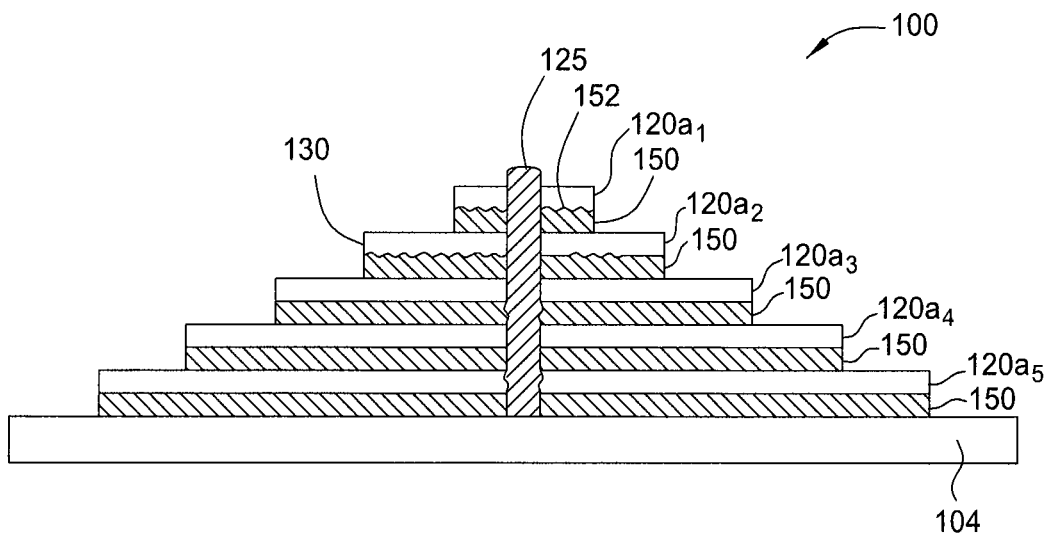
Figure 2:
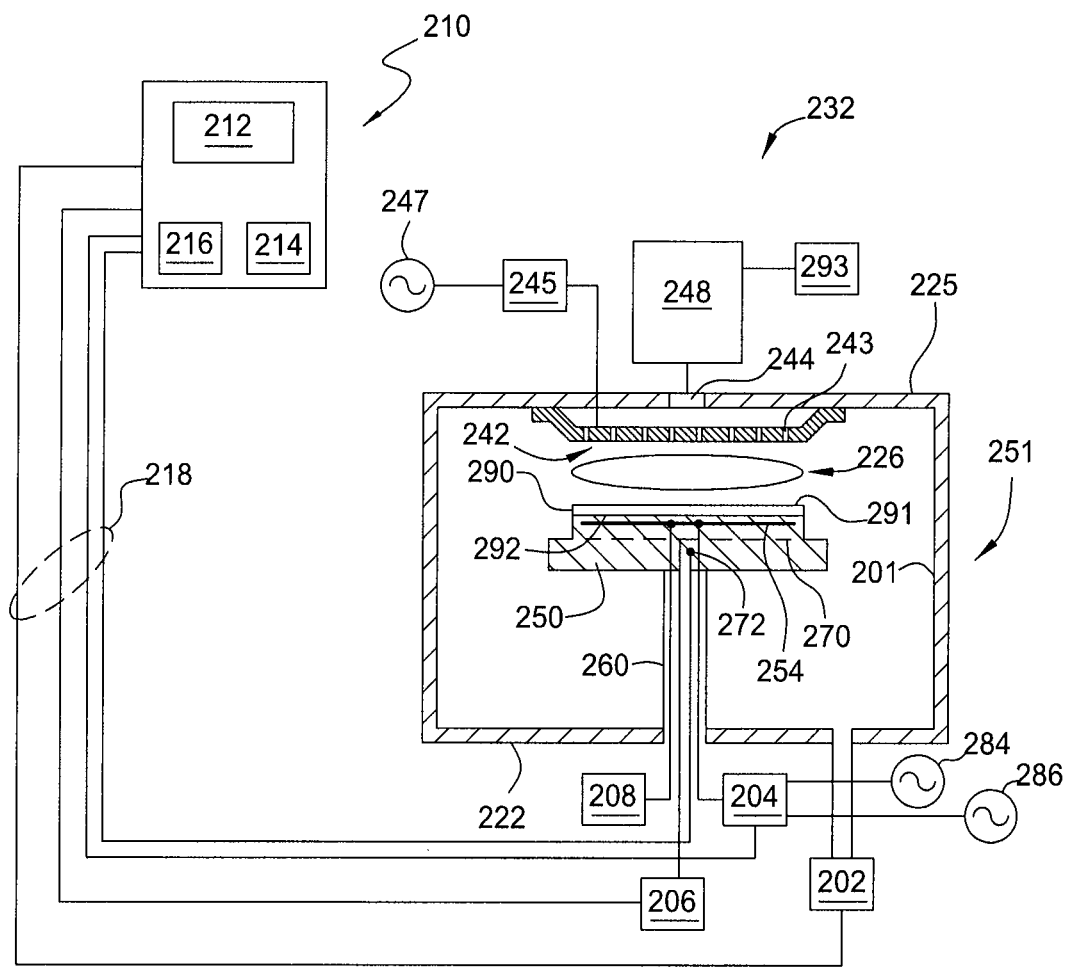
FIG. 2 depicts an apparatus utilized to form a metal containing layer in stair-like structures on a substrate in accordance with one embodiment of the present disclosure.

FIG. 2 is a cross sectional view of a plasma processing chamber 232 suitable for performing a plasma deposition process (e.g., a plasma enhanced CVD or a metal organic CVD) that may be utilized as semiconductor interconnection structures for semiconductor devices manufacture. The processing chamber 232 may be a suitably adapted CENTURA®, PRODUCER® SE or PRODUCER® GT or PRODUCER® XP processing system available from Applied Materials, Inc., of Santa Clara, Calif. It is contemplated that other processing systems, including those produced by other manufacturers, may benefit from embodiments described herein.

The processing chamber 232 includes a chamber body 251. The chamber body 251 includes a lid 225, a sidewall 201 and a bottom wall 222 that define an interior volume 226.

A substrate support pedestal 250 is provided in the interior volume 126 of the chamber body 251. The pedestal 250 may be fabricated from aluminum, ceramic, aluminum nitride, and other suitable materials. In one embodiment, the pedestal 250 is fabricated by a ceramic material, such as aluminum nitride, which is a material suitable for use in a high temperature environment, such as a plasma process environment, without causing thermal damage to the pedestal 250. The pedestal 250 may be moved in a vertical direction inside the chamber body 251 using a lift mechanism (not shown).

The pedestal 250 may include an embedded heater element 270 suitable for controlling the temperature of a substrate 290 supported on the pedestal 250. In one embodiment, the pedestal 250 may be resistively heated by applying an electric current from a power supply 206 to the heater element 270. In one embodiment, the heater element 270 may be made of a nickel-chromium wire encapsulated in a nickel-iron-chromium alloy (e.g., INCOLOY®) sheath tube. The electric current supplied from the power supply 206 is regulated by the controller 210 to control the heat generated by the heater element 270, thus maintaining the substrate 290 and the pedestal 250 at a substantially constant temperature during film deposition at any suitable temperature range. In another embodiment, the pedestal may be maintained at room temperature as needed. In yet another embodiment, the pedestal 250 may also include a chiller (not shown) as needed to cool the pedestal 250 at a range lower than room temperature as needed. The supplied electric current may be adjusted to selectively control the temperature of the pedestal 250 between about 100 degrees Celsius to about 700 degrees Celsius.

A temperature sensor 272, such as a thermocouple, may be embedded in the substrate support pedestal 250 to monitor the temperature of the pedestal 250 in a conventional manner. The measured temperature is used by the controller 210 to control the power supplied to the heater element 270 to maintain the substrate at a desired temperature.

The pedestal 250 generally includes a plurality of lift pins (not shown) disposed therethrough that are configured to lift the substrate 290 from the pedestal 250 and facilitate exchange of the substrate 290 with a robot (not shown) in a conventional manner.

The pedestal 250 comprises at least one electrode 292 for retaining the substrate 290 on the pedestal 250. The electrode 292 is driven by a chucking power source 208 to develop an electrostatic force that holds the substrate 290 to the pedestal surface, as is conventionally known. Alternatively, the substrate 290 may be retained to the pedestal 250 by clamping, vacuum or gravity.

In one embodiment, the pedestal 250 is configured as a cathode having the electrode 292 embedded therein coupled to at least one RF bias power source, shown in FIG. 2 as two RF bias power sources 284, 286. Although the example depicted in FIG. 2 shows two RF bias power sources 284, 286, it is noted that the number of the RF bias power sources may be any number as needed. The RF bias power sources 284, 286 are coupled between the electrode 292 disposed in the pedestal 250 and another electrode, such as a gas distribution plate 242 or lid 225 of the processing chamber 232. The RF bias power source 284, 286 excites and sustains a plasma discharge formed from the gases disposed in the processing region of the processing chamber 232.

In the embodiment depicted in FIG. 2, the dual RF bias power sources 284, 286 are coupled to the electrode 292 disposed in the pedestal 250 through a matching circuit 204. The signal generated by the RF bias power source 284, 286 is delivered through matching circuit 204 to the pedestal 250 through a single feed to ionize the gas mixture provided in the plasma processing chamber 232, thereby providing ion energy necessary for performing a deposition or other plasma enhanced process. The RF bias power sources 284, 286 are generally capable of producing an RF signal having a frequency of from about 50 kHz to about 200 MHz and a power between about 0 Watts and about 5000 Watts.

A vacuum pump 202 is coupled to a port formed in the bottom 222 of the chamber body 251. The vacuum pump 202 is used to maintain a desired gas pressure in the chamber body 251. The vacuum pump 202 also evacuates post-processing gases and by-products of the process from the chamber body 251.

The processing chamber 232 includes one or more gas delivery passages 244 coupled through the lid 225 of the processing chamber 232. The gas delivery passages 244 and the vacuum pump 202 are positioned at opposite ends of the processing chamber 232 to induce laminar flow within the interior volume 226 to minimize particulate contamination.

The gas delivery passage 244 is coupled to the gas panel 293 through a remote plasma source (RPS) 248 to provide a gas mixture into the interior volume 226. In one embodiment, the gas mixture supplied through the gas delivery passage 244 may be further delivered through a gas distribution plate 242 disposed below the gas delivery passage 244. In one example, the gas distribution plate 242 having a plurality of apertures 243 is coupled to the lid 225 of the chamber body 251 above the pedestal 250. The apertures 243 of the gas distribution plate 242 are utilized to introduce process gases from the gas panel 293 into the chamber body 251. The apertures 243 may have different sizes, number, distributions, shape, design, and diameters to facilitate the flow of the various process gases for different process requirements. A plasma is formed from the process gas mixture exiting the gas distribution plate 242 to enhance thermal decomposition of the process gases resulting in the deposition of material on the surface 291 of the substrate 290.

The gas distribution plate 242 and substrate support pedestal 250 may be formed a pair of spaced apart electrodes in the interior volume 226. One or more RF sources 247 provide a bias potential through a matching network 245 to the gas distribution plate 242 to facilitate generation of a plasma between the gas distribution plate 242 and the pedestal 250. Alternatively, the RF sources 247 and matching network 245 may be coupled to the gas distribution plate 242, substrate support pedestal 250, or coupled to both the gas distribution plate 242 and the substrate support pedestal 250, or coupled to an antenna (not shown) disposed exterior to the chamber body 251. In one embodiment, the RF sources 247 may provide between about 10 Watts and about 3000 Watts at a frequency of about 30 kHz to about 13.6 MHz. Alternatively, the RF source 247 may be a microwave generator that provide microwave power to the gas distribution plate 242 that assists generation of the plasma in the interior volume 226.

Examples of gases that may be supplied from the gas panel 293 may include a silicon containing gas, fluorine continuing gas, oxygen containing gas, hydrogen containing gas inert gas and carrier gases. Suitable examples of the reacting gases includes a silicon containing gas, such as $SiH_4$, $Si_2H_6$, $SiF_4$, $SiH_2Cl_2$, $Si_4H_{10}$, $Si_5H_{12}$, TEOS and the like. Suitable carrier gas includes nitrogen ($N_2$), argon (Ar), hydrogen ($H_2$), alkanes, alkenes, helium (He), oxygen ($O_2$), ozone ($O_3$), water vapor ($H_2O$), and the like.

In one embodiment, the remote plasma source (RPS) 248 may be alternatively coupled to the gas delivery passages 244 to assist in forming a plasma from the gases supplied from the gas panel 293 into the in the interior volume 226. The remote plasma source 248 provides plasma formed from the gas mixture provided by the gas panel 293 to the processing chamber 232.

The controller 210 includes a central processing unit (CPU) 212, a memory 216, and a support circuit 214 utilized to control the process sequence and regulate the gas flows from the gas panel 293. The CPU 212 may be of any form of a general purpose computer processor that may be used in an industrial setting. The software routines can be stored in the memory 216, such as random access memory, read only memory, floppy, or hard disk drive, or other form of digital storage. The support circuit 214 is conventionally coupled to the CPU 212 and may include cache, clock circuits, input/output systems, power supplies, and the like. Bi-directional communications between the controller 210 and the various components of the processing chamber 232 are handled through numerous signal cables collectively referred to as signal buses 218, some of which are illustrated in FIG. 2.

Figure 3:
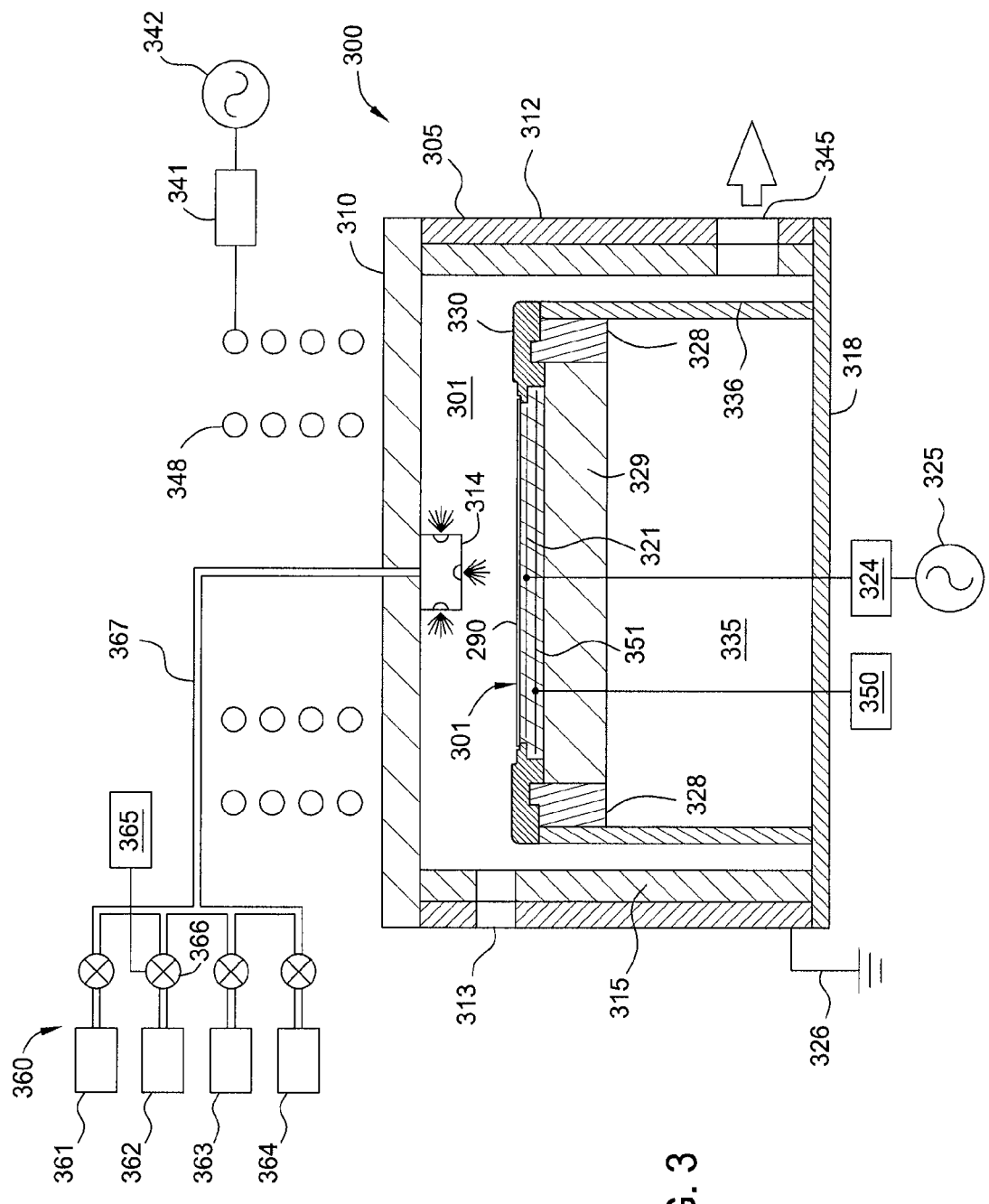
FIG. 3 depicts an apparatus utilized to form stair-like structures on a substrate in accordance with one embodiment of the present disclosure.

FIG. 3 is a simplified cutaway view for an exemplary etching processing chamber 300 for etching a metal layer. The exemplary etching processing chamber 300 is suitable for removing one or more film layers from the substrate 290. One example of the process chamber that may be adapted to benefit from the invention is an AdvantEdge Mesa Etch processing chamber, available from Applied Materials, Inc., located in Santa Clara, Calif. It is contemplated that other process chambers, including those from other manufactures, may be adapted to practice embodiments of the invention.

The etch processing chamber 300 includes a chamber body 305 having a chamber volume 301 defined therein. The chamber body 305 has sidewalls 312 and a bottom 318 which are coupled to ground 326. The sidewalls 312 have a liner 315 to protect the sidewalls 312 and extend the time between maintenance cycles of the etching processing chamber 300. The dimensions of the chamber body 305 and related components of the etching processing chamber 300 are not limited and generally are proportionally larger than the size of the substrate 290 to be processed therein. Examples of substrate sizes include 200 mm diameter, 250 mm diameter, 300 mm diameter and 450 mm diameter, among others.

The chamber body 305 supports a chamber lid assembly 310 to enclose the chamber volume 301. The chamber body 305 may be fabricated from aluminum or other suitable materials. A substrate access port 313 is formed through the sidewall 312 of the chamber body 105, facilitating the transfer of the substrate 290 into and out of the etching processing chamber 300. The access port 313 may be coupled to a transfer chamber and/or other chambers of a substrate processing system (not shown).

A pumping port 345 is formed through the sidewall 312 of the chamber body 305 and connected to the chamber volume 301. A pumping device (not shown) is coupled through the pumping port 345 to the chamber volume 301 to evacuate and control the pressure therein. The pumping device may include one or more pumps and throttle valves.

A gas panel 360 is coupled by a gas line 367 to the chamber body 305 to supply process gases into the chamber volume 301. The gas panel 360 may include one or more process gas sources 361, 362, 363, 364 and may additionally include inert gases, non-reactive gases, and reactive gases, if desired. Examples of process gases that may be provided by the gas panel 360 include, but are not limited to, hydrocarbon containing gas including methane (CH$_4$), sulfur hexafluoride (SF$_6$), carbon tetrafluoride (CF$_4$), hydrogen bromide (HBr), hydrocarbon containing gas, argon gas (Ar), chlorine (Cl$_2$), nitrogen (N2), and oxygen gas (O$_2$). Additionally, process gasses may include chlorine, fluorine, oxygen and hydrogen containing gases such as BCl$_3$, C$_4$F$_8$, C$_4$F$_6$, CHF$_3$, CH$_2$F$_2$, CH$_3$F, NF$_3$, CO$_2$, SO$_2$, CO, and H$_2$ among others.

Valves 366 control the flow of the process gases from the sources 361, 362, 363, 364 from the gas panel 360 and are managed by a controller 365. The flow of the gases supplied to the chamber body 305 from the gas panel 360 may include combinations of the gases.

The lid assembly 310 may include a nozzle 314. The nozzle 314 has one or more ports for introducing the process gases from the sources 361, 362, 364, 363 of the gas panel 360 into the chamber volume 301. After the process gases are introduced into the etching processing chamber 300, the gases are energized to form plasma. An antenna 348, such as one or more inductor coils, may be provided adjacent to the etching processing chamber 300. An antenna power supply 342 may power the antenna 348 through a match circuit 341 to inductively couple energy, such as RF energy, to the process gas to maintain a plasma formed from the process gas in the chamber volume 301 of the etch processing chamber 300. Alternatively, or in addition to the antenna power supply 342, process electrodes below the substrate 290 and/or above the substrate 290 may be used to capacitively couple RF power to the process gases to maintain the plasma within the chamber volume 301. The operation of the power supply 342 may be controlled by a controller, such as controller 365, that also controls the operation of other components in the etch processing chamber 300.

A substrate support pedestal 335 is disposed in the chamber volume 301 to support the substrate 290 during processing. The support pedestal 335 may include an electro-static chuck 322 for holding the substrate 290 during processing. The electro-static chuck (ESC) 322 uses the electro-static attraction to hold the substrate 290 to the substrate support pedestal 335. The ESC 322 is powered by an RF power supply 325 integrated with a match circuit 324. The ESC 322 comprises an electrode 321 embedded within a dielectric body. The RF power supply 325 may provide a RF chucking voltage of about 200 volts to about 2000 volts to the electrode 321. The RF power supply 325 may also include a system controller for controlling the operation of the electrode 321 by directing a DC current to the electrode 321 for chucking and de-chucking the substrate 290.

The ESC 322 may also include an electrode 351 deposited therein. The electrode 351 is coupled to a power source 350 and provides a bias which attracts plasma ions, formed by the process gases in the chamber volume 301, to the ESC 322 and substrate 290 positioned thereon. The power source 350 may cycle on and off, or pulse, during processing of the substrate 290. The ESC 322 has an isolator 328 for the purpose of making the sidewall of the ESC 322 less attractive to the plasma to prolong the maintenance life cycle of the ESC 322. Additionally, the substrate support pedestal 335 may have a cathode liner 336 to protect the sidewalls of the substrate support pedestal 335 from the plasma gases and to extend the time between maintenance of the plasma etch processing chamber 300.

The ESC 322 may include heaters disposed therein and connected to a power source (not shown), for heating the substrate, while a cooling base 329 supporting the ESC 322 may include conduits for circulating a heat transfer fluid to maintain a temperature of the ESC 322 and the substrate 290 disposed thereon. The ESC 322 is configured to perform in the temperature range required by the thermal budget of the device being fabricated on the substrate 290. For example, the ESC 322 may be configured to maintain the substrate 290 at a temperature of about minus about 25 degrees Celsius to about 500 degrees Celsius for certain embodiments.

The cooling base 329 is provided to assist in controlling the temperature of the substrate 290. To mitigate process drift and time, the temperature of the substrate 290 may be maintained substantially constant by the cooling base 329 throughout the time the substrate 290 is in the etch chamber 300. In one embodiment, the temperature of the substrate 290 is maintained throughout subsequent etch processes at about 70 to 90 degrees Celsius.

A cover ring 330 is disposed on the ESC 322 and along the periphery of the substrate support pedestal 335. The cover ring 330 is configured to confine etching gases to a desired portion of the exposed top surface of the substrate 290, while shielding the top surface of the substrate support pedestal 335 from the plasma environment inside the etch processing chamber 300. Lift pins (not shown) are selectively moved through the substrate support pedestal 335 to lift the substrate 290 above the substrate support pedestal 335 to facilitate access to the substrate 290 by a transfer robot (not shown) or other suitable transfer mechanism.

The controller 365 may be utilized to control the process sequence, regulating the gas flows from the gas panel 360 into the etch processing chamber 300 and other process parameters. Software routines, when executed by the CPU, transform the CPU into a specific purpose computer (controller) that controls the etch processing chamber 300 such that the processes are performed in accordance with the present invention. The software routines may also be stored and/or executed by a second controller (not shown) that is collocated with the etch processing chamber 300.

The substrate 290 has various film layers disposed thereon which may include at least one metal layer. The various film layers may require etch recipes which are unique for the different compositions of the other film layers in the substrate 290. Multilevel interconnects that lie at the heart of the VLSI and ULSI technology may require the fabrication of high aspect ratio features, such as vias and other interconnects. Constructing the multilevel interconnects may require one or more etch recipes to form patterns in the various film layers. These recipes may be performed in a single etch processing chamber or across several etch processing chambers. Each etch processing chamber may be configured to etch with one or more of the etch recipes. In one embodiment, etch processing chamber 300 is configured to at least etch a metal layer to form an interconnection structure. For processing parameters provided herein, the etch processing chamber 300 is configured to process a 300 diameter substrate, i.e., a substrate having a plan area of about 0.0707 m$^2$. The process parameters, such as flow and power, may generally be scaled proportionally with the change in the chamber volume or substrate plan area.

Figure 4:
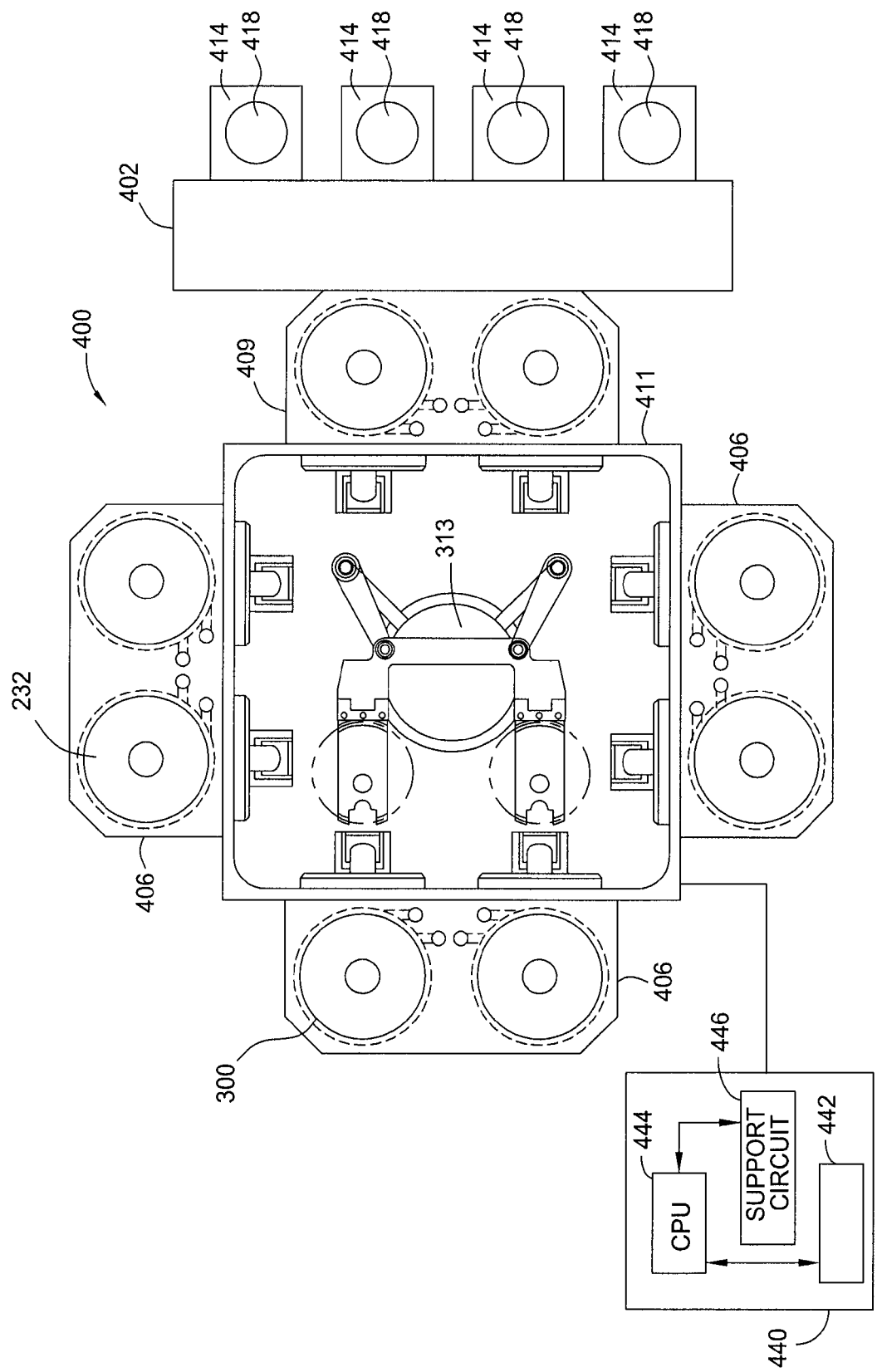
FIG. 4 depicts a schematic view of a cluster processing system that includes the apparatus of FIGS. 2 and 3.

FIG. 4 depicts a plan view of a semiconductor processing system 400 that the methods described herein may be practiced. One processing system that may be adapted to benefit from the invention is a 300 mm or 450 mm Producer® processing system, commercially available from Applied Materials, Inc., of Santa Clara, Calif. The processing system 400 generally includes a front platform 402 where substrate cassettes 418 included in FOUPs 414 are supported and substrates are loaded into and unloaded from a loadlock chamber 409, a transfer chamber 411 housing a substrate handler 413 and a series of tandem processing chambers 406 mounted on the transfer chamber 411.

Each of the tandem processing chambers 406 includes two process regions for processing the substrates. The two process regions share a common supply of gases, common pressure control, and common process gas exhaust/pumping system. Modular design of the system enables rapid conversion from one configuration to any other. The arrangement and combination of chambers may be altered for purposes of performing specific process steps. Any of the tandem processing chambers 406 can include a lid according to aspects of the invention as described below that includes one or more chamber configurations described above with referenced to the processing chamber 232, 300 depicted in FIG. 2 and/or FIG. 3. It is noted that the processing system 400 may be configured to perform a deposition process, etching process, curing processes, or heating/annealing process as needed. In one embodiment, the processing chambers 232, 300, shown as a single chamber designed in FIGS. 2 and 3, may be incorporated into the semiconductor processing system 400.

In one implementation, the processing system 400 can be adapted with one or more of the tandem processing chambers having supporting chamber hardware known to accommodate various other known processes such as chemical vapor deposition (CVD), physical vapor deposition (PVD), etching, curing, or heating/annealing and the like. For example, the system 400 can be configured with one of the processing chambers 232 in FIG. 2 as a plasma deposition chamber for deposition, such as a metal film, or one of the processing chambers 300 depicted in FIG. 3 as a plasma etching chamber for etching material layers formed on the substrates. Such a configuration can maximize research and development fabrication utilization and, if desired, eliminate exposure of films as etched to atmosphere.

A controller 440, including a central processing unit (CPU) 444, a memory 442, and support circuits 446, is coupled to the various components of the semiconductor processing system 400 to facilitate control of the processes of the present invention. The memory 442 can be any computer-readable medium, such as random access memory (RAM), read only memory (ROM), floppy disk, hard disk, or any other form of digital storage, local or remote to the semiconductor processing system 400 or CPU 444. The support circuits 446 are coupled to the CPU 444 for supporting the CPU in a conventional manner. These circuits include cache, power supplies, clock circuits, input/output circuitry and subsystems, and the like. A software routine or a series of program instructions stored in the memory 442, when executed by the CPU 444, executes the tandem processing chambers 406.

Figure 5:
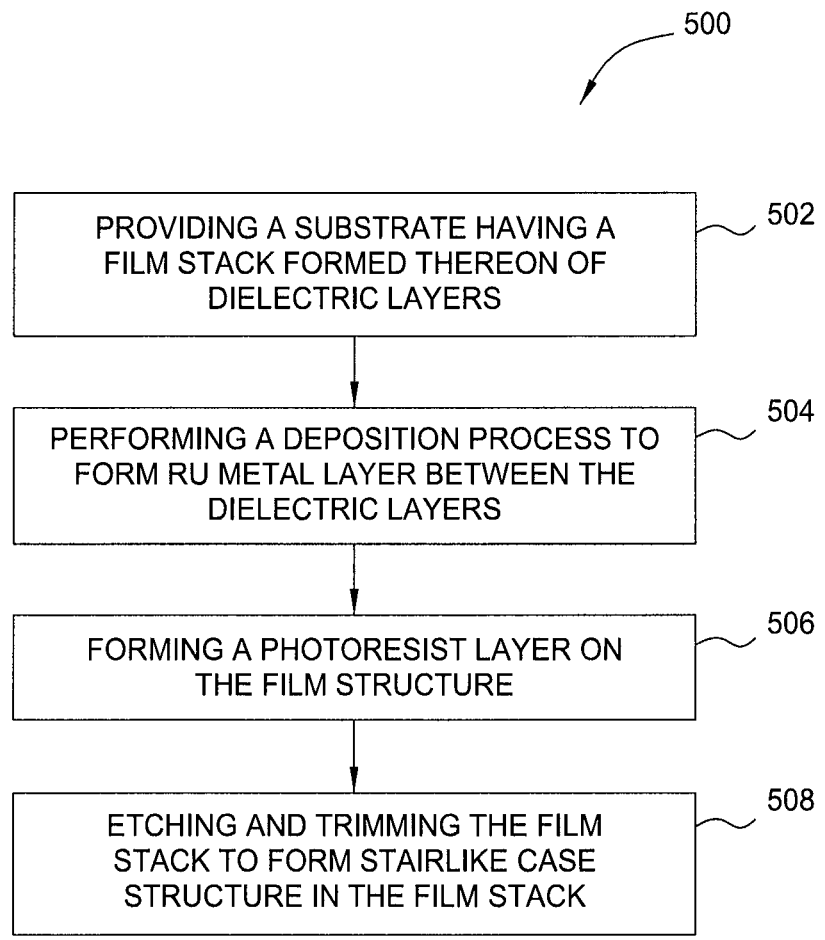
FIG. 5 depicts a flow diagram of a method for stair-like structures formed on a substrate in accordance with one embodiment of the present disclosure.

FIG. 5 is a flow diagram of one embodiment of a method 500 for forming stair-like structures in a film stack disposed on a substrate that may be performed in a processing chamber, such as the processing chamber 232 depicted in FIG. 2 and the processing chamber 300 depicted in FIG. 3 incorporated in the system 400 or other suitable processing chambers and system as needed. FIGS. 6A-6H are schematic cross-sectional views illustrating a sequence for forming stair-like structures in a film stack disposed on a substrate according to the method 500. Although the method 500 is described below with reference to a substrate utilized to manufacture stair-like structures in a film stack for three dimensional semiconductor devices, the method 500 may also be used to advantage in other device manufacturing applications.

Figure 6A:
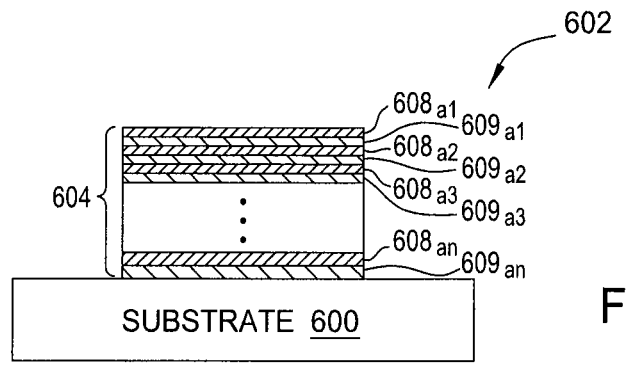
FIGS. 6A-6H depict one embodiment of a sequence for manufacturing stair-like structures formed on a substrate in accordance with the embodiment depicted in FIG. 5.

The method 500 begins at operation 502 by transferring a substrate, such as a substrate 600 depicted in FIG. 6A into a processing chamber, such as the processing chamber 232 depicted in FIG. 2 or the processing chamber 300 depicted in FIG. 3. The substrate 600 may be a silicon based material or any suitable insulating materials or conductive materials as needed, having a film stack 602 disposed on the substrate 600 that may be utilized to form desired stair-like structures in the film stack 602.

As shown in the exemplary embodiment depicted in FIG. 6A, the substrate 600 may have a substantially planar surface, an uneven surface, or a substantially planar surface having a structure formed thereon. The film stack 602 is formed on the substrate 600. In one embodiment, the film stack 602 may be utilized to form a gate structure, a contact structure or an interconnection structure in the front end or back end processes. The method 500 may be formed on the film stack 602 to form the stair-like structures therein used in a memory structure, such as VNAND structure. In one embodiment, the substrate 600 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI, carbon doped silicon oxides, silicon nitride, doped silicon, germanium, gallium arsenide, glass, sapphire. The substrate 600 may have various dimensions, such as 200 mm, 300 mm, 450 mm or other diameter wafers, as well as, rectangular or square panels. Unless otherwise noted, embodiments and examples described herein are conducted on substrates with a 200 mm diameter, a 300 mm diameter, a 450 mm diameter substrate. In the embodiment wherein a SOI structure is utilized for the substrate 600, the substrate 600 may include a buried dielectric layer disposed on a silicon crystalline substrate. In the embodiment depicted herein, the substrate 600 may be a crystalline silicon substrate.

In one embodiment, the film stack 602 disposed on the substrate 600 may have a multi-material layer 604 that has a number of vertically stacked layers. The multi-material layer 604 may comprise pairs including a first layer (shown as $608a_1, 608a_2, \ldots, 608a_n$) and a second layer (shown as $609a_1, 609a_2, \ldots, 609a_n$) repeatedly formed in the multi-material layer 604. The pairs includes alternating first layer (shown as $608a_1, 608a_2, \ldots, 608a_n$) and second layer (shown as $609a_1, 609a_2, \ldots, 609a_n$) repeatedly formed until desired numbers of pairs of the first layers and the second layers are reached.

The multi-material layer 604 formed in the film stack 602 may be a part of a semiconductor chip, such as a three-dimensional (3D) memory chip. Although three repeating layers of first layers (shown as $608a_1, 608a_2, \ldots, 608a_n$) and second layers (shown as $609a_1, 609a_2, \ldots, 609a_n$) are shown in FIG. 6A-6H, it is noted that any desired number of repeating pairs of the first and the second layers may be utilized as needed.

In one embodiment, the multi-material layers 604 may be utilized to form multiple gate structures for a three-dimensional (3D) memory chip. The first layers $608a_1, 608a_2, \ldots, 608a_n$, formed in the multi-material layer 604 may be a first dielectric layer and the second layers $609a_1, 609a_2, \ldots, 609a_n$ may be a second dielectric layer. Suitable dielectric layers may be utilized to form the first layers $608a_1, 608a_2, \ldots, 608a_n$ and the second layer $609a_1, 609a_2, \ldots, 609a_n$, include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In some embodiments, the dielectric layers may be a high-k material having a dielectric constant greater than 4. Suitable examples of the high-k materials include hafnium dioxide (HfO$_2$), zirconium dioxide (ZrO$_2$), hafnium silicon oxide (HfSiO$_2$), hafnium aluminum oxide (HfAlO), zirconium silicon oxide (ZrSiO2), tantalum dioxide (TaO$_2$), aluminum oxide, aluminum doped hafnium dioxide, bismuth strontium titanium (BST), and platinum zirconium titanium (PZT), among others.

In one particular example, the first layers $608a_1$, $608a_2$, ..., $608a_n$ are silicon oxide layers and the second layers $609a_1$, $609a_2$, ..., $609a_n$ are silicon nitride layers or polysilicon layers disposed on the first layers $608a_1$, $608a_2$, ..., $608a_n$. In one embodiment, the thickness of first layers $608a_1$, $608a_2$, ..., $608a_n$ may be controlled at between about 50 Å and about 1000 Å, such as about 500 Å, and the thickness of the each second layers $609a_1$, $609a_2$, ..., $609a_n$ may be controlled at between about 50 Å and about 1000 Å, such as about 500 Å. The multi-material layers 604 may have a total thickness between about 100 Å and about 2000 Å. The total thickness of the multi-material layers 604 is about 3 microns to 10 microns and will vary as the technology advances.

Figure 6B:
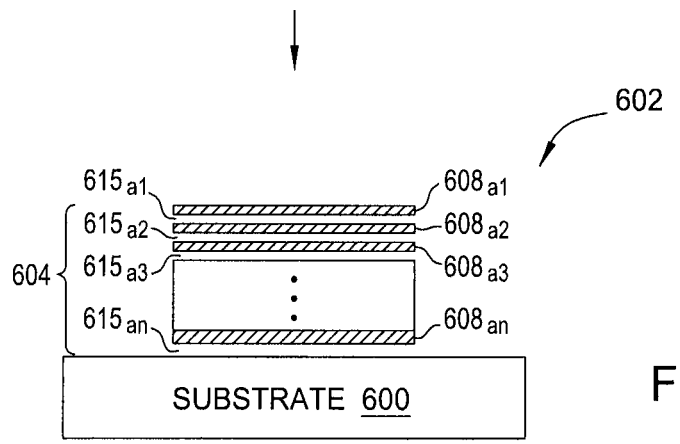

After the film stack 604 of the first layers $608a_1$, $608a_2$, ..., $608a_n$ of silicon oxide layers and the second layers $609a_1$, $609a_2$, ..., $609a_n$ of silicon nitride layers are formed on the substrate 600, the second layers $609a_1$, $609a_2$, ..., $609a$, of silicon nitride layers may be selectively removed, as shown in FIG. 6B, leaving spaces $615a_1$, $615a_2$, ..., $615a_n$ where the second layers $609a_1$, $609a_2$, ..., $609a_n$ were located. After removal of the second layers $609a_1$, $609a_2$, ..., $609a$, of silicon nitride from the film stack 602, a suspended film stack 206 with only the first layers $608a_1$, $608a_2$, ..., $608a_n$ of silicon oxide layers is then remained on the substrate 600 for further processing. Removal of the second layers $609a_1$, $609a_2$, ..., $609a_n$ of silicon nitride layers may utilize any suitable etching or patterning process to selectively remove the second layers $609a_1$, $609a_2$, ..., $609a_n$ of silicon nitride layers from the film stack 604 without undesirably damaging the first layers $608a_1$, $608a_2$, ..., $608a_n$ of silicon oxide layers. In one example, the second layers $609a_1$, $609a_2$, ..., $609a_n$ of silicon nitride may be removed in the processing chamber 300 depicted in FIG. 3.

Figure 6C:
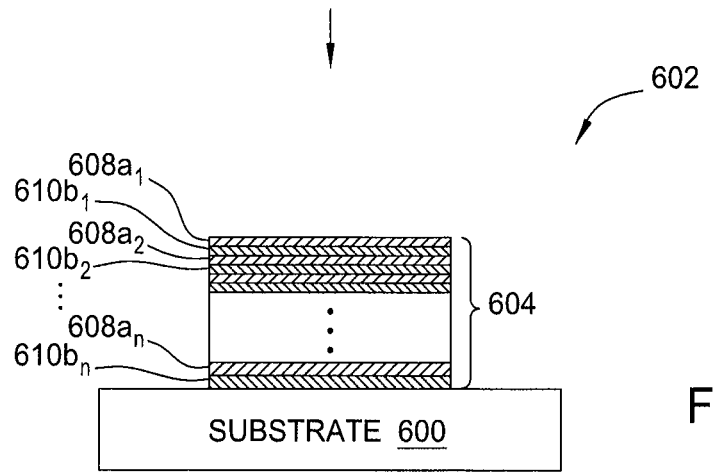

At operation 504, a deposition process is performed to form a metal conductive layer (shown as $610b_1$, $610b_2$, ..., $610b_n$) in the spaces $615a_1$, $615a_2$, ..., $615a$, created by removal of the second layers $609a_1$, $609a_2$, ..., $609a_n$ of silicon nitride layers in the film stack 604, as shown in FIG. 6C. It is believed that the metal material utilized in the film stack 604 may efficiently improve the electrical performance, such as electrical conductivity, and mobility, and the like, in the film stack 602 when later utilized as a gate structure in NAND or VNAND three dimensional semiconductor chip devices. The deposition process may be a metal organic chemical vapor deposition (MOCVD) process or a sputtering physical vapor deposition process, or other suitable process as needed. may be performed in the processing chamber 232 depicted in FIG. 2 to form the metal conductive layer $610b_1$, $610b_2$, ..., $610b_n$. Suitable examples of the metal conductive layer $610b_1$, $610b_2$, ..., $610b_n$ may be selected from a group consisting of tungsten (W), tungsten silicide (WSi), tungsten polysilicon (W/poly), tungsten alloy, tantalum (Ta), titanium (Ti), copper (Cu), ruthenium (Ru), nickel (Ni), cobalt (Co), chromium (Cr), iron (Fe), manganese (Mn), aluminum (Al), hafnium (Hf), vanadium (V), molybdenum (Mo), palladium (Pd), gold (Au), silver (Au), platinum (Pt), alloys thereof, nitride compound thereof, such as titanium nitride (TiN) and tantalum nitride (TaN), and combinations thereof, among others.

In one particular example, the metal conductive layer $610b_1$, $610b_2$, ..., $610b_n$ may be ruthenium (Ru) containing layer.

In the embodiment wherein the deposition process is a MOCVD process, the deposition process may be performed by supplying a deposition gas mixture including at least a ruthenium (Ru) containing precursor into the processing chamber 232 of FIG. 2. The ruthenium (Ru) containing precursor may have a formula of $R_xRu_yR'_z$, where R and R' are H, $CH_3$, $C_2H_5$, $C_3H_7$, CO, NCO, methyl, ethyl, propyl, isopropyl, butyl, isobutyl, tertiary butyl, alkyl or aryl group and x, y and z are integers having a range between 1 and 8.

In some embodiments, a variety of other processing gases may be added to the gas mixture to modify properties of the ruthenium (Ru) containing layer. For example, a reactive gas, such as hydrogen ($H_2$), ammonia ($NH_3$), a mixture of hydrogen ($H_2$) and nitrogen ($N_2$), or combinations thereof, may be optionally and selectively supplied in the deposition gas mixture to assist depositing the ruthenium (Ru) containing layer. A carrier gas, such as nitrogen ($N_2$) and nitric oxide (NO), or and/or inert gas, such as argon (Ar) and helium (He), may be supplied with the deposition gas mixture into the processing chamber 232. The addition of different reactive gases or inert gases may change the film structure and/or film chemical components, such as reflectivity, thereby adjusting the deposited film to have a desired film property to meet different process requirements.

Alternatively, in the example wherein the ruthenium (Ru) containing layer is formed by a physical vapor deposition process (PVD), such as a sputtering deposition process, a target with metal ruthenium (Ru), metal ruthenium (Ru) containing material, or ruthenium (Ru) containing alloy may be utilized to perform a sputtering deposition to form the ruthenium (Ru) containing layer.

During deposition of the metal conductive layer $610b_1$, $610b_2$, ..., $610b_n$ of ruthenium (Ru) containing layer, several process parameters may be regulated the process. In one embodiment suitable for processing a 300 mm substrate, the process pressure may be maintained at about 0.1 Torr to about 80 Torr, for example, about 1 Torr to about 20 Torr. The spacing between the substrate and showerhead may be controlled at about 200 mils to about 1000 mils. The substrate temperature of the deposition process is maintained between about 300 degrees Celsius and about 900 degrees Celsius.

Figure 6D:
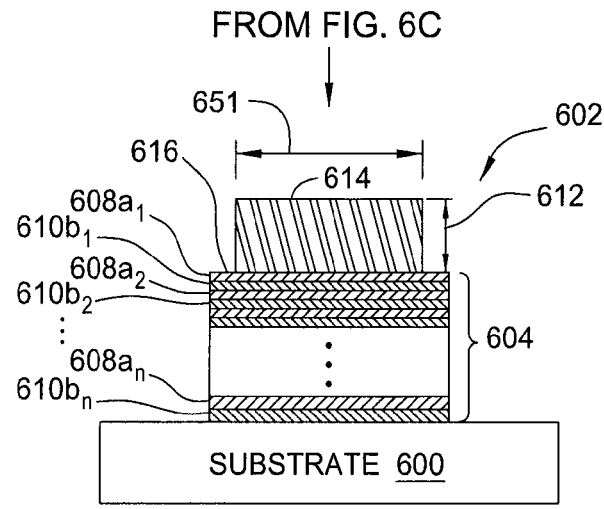

At operation 506, after the metal conductive layer $610b_1$, $610b_2$, ..., $610b_n$ of the ruthenium (Ru) containing layer is formed in the film stack 604, a patterned photoresist layer 614, a lithographically patterned mask, is then formed over the multi-material layer 604 exposing portions 606 of the first layers $608a_1$, $608a_2$, ..., $608a_n$ for etching, as shown in FIG. 6D. In one embodiment, the photoresist layer 614 may is a positive tone photoresist, a negative tone photoresist, a UV lithography photoresist, an i-line photoresist, an e-beam resist (for example, a chemically amplified resist (CAR)) or other suitable photoresist. In one embodiment, the photoresist layer 614 may include organic polymer materials, such as fluoropolymers, silicon-containing polymers, hydroxy styrene, or acrylic acid monomers to provide acid groups when the photoresist layer 614 is exposed to radiation. The choice of the material for the photoresist layer 614 depends on the particular microelectronic device processing application being performed. In particular, the choice of the material for the photoresist layer 614 depends on the properties of the photoresist layer 614 at a given wavelength of radiation. In alternate embodiments, the photoresist layer 614 is optimized to a wavelength of radiation, e.g., 365 nm, 248 nm, 193 nm, 157 nm, and 13 nm. In one embodiment, the photoresist layer 614 may be deposited to have a first width 651 (e.g., an initial width) and a depth 612 (e.g., an initial width) and the first width 651 may be between about 20 μm and about 60 μm.

Figure 6E:
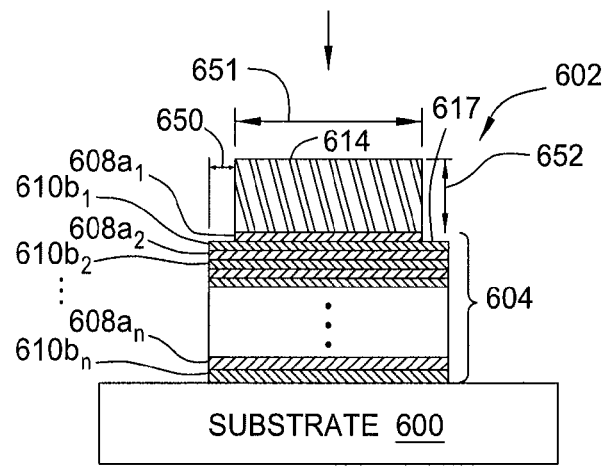

At operation 508, after the photoresist layer 614 is formed on the film stack 604, an etching process may be then performed to etch the first layer $608a_1$, $608a_2$, ..., $608a_n$ from the exposed surface 616, until a surface 617 the underlying metal conductive layer $610b_1$, $610b_2$, ..., $610b_n$ is exposed, as shown in FIG. 6E. The etching process is performed to first etch the first layer $608a_1$, $608a_2$, ..., $608a_n$ and then the metal conductive layer $610b_1$, $610b_2$, ..., $610b_n$.

Figure 6F:
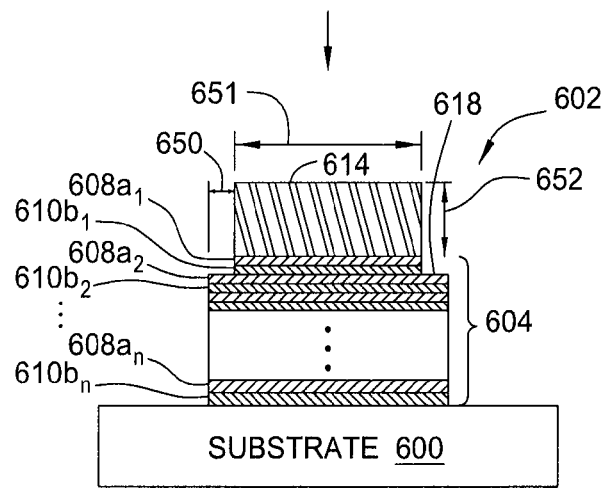

While etching, a first etching gas mixture is first supplied to etch the first layer $608a_1$, $608a_2$, ..., $608a_n$ with high selectivity to the underlying metal conductive layer $610b_1$, $610b_2$, ..., $610b_n$. The patterned photoresist layer 614 servers as an etching mask during the etching process of the first layer $608a_1$ of the multi-material layer 604. Subsequently, the etching process may be continuously performed to etch the metal conductive layer $610b_1$ of the multi-material layer 604 through the exposed surface 617 using a second etching gas mixture supplied during the etching process, until a surface 618 if the underlying first layer $608a_2$ of the multi-material layer 604 is exposed, as shown in FIG. 6F.

The patterns from the photoresist layer 614 are transferred into the first layer $608a_1$ and the metal conductive layer $610b_1$ after a first cycle of the first etching gas mixture and the second etching gas mixture in the etching process, forming a first stair-like structure including the patterned first layer $608a_1$ and the metal conductive layer $610b_1$ in the multi-material layers 604 through the etching process, as shown in FIG. 4F. The etching process may be continuously performed until the surface 618 of the first layer $608a_2$ included in another pair in the multi-material layer 604 is exposed with the patterned photoresist layer 614 disposed thereon.

In one embodiment, the first etching gas mixture selected to etch the first layer $608a_1$ may have different chemistries from the second etching gas mixture selected to etch the metal conductive layer $610b_1$ as a dielectric material has different film properties from a metal conductive material. In one example, the first etching gas mixture utilized to etch the first layer $608a_1$, a silicon oxide layer, includes a fluorine-carbon gas having a formula of $C_xF_y$, such as $C_4F_6$, $C_4F_8$, $CF_4$, $CF_4$, $CHF_3$, $CH_2F_2$, or combinations thereof, while the x and y represents integers between 1 and 20. The first etching mixture may further includes a reacting gas, such as an oxygen containing gas (e.g., $O_3$, $O_2$, $CO_2$, CO or $H_2O$) and optionally may include an inert gas, such as Ar or He.

In contrast, the second etching gas mixture utilized to etch the metal conductive layer $610b_1$ includes an oxygen containing gas, such as $O_3$, $O_2$ or $H_2O$, NO, $NO_2$, $N_2O$, CO, $CO_2$ and the like, to etch the metal conductive layer $610b_1$, such as a ruthenium (Ru) material. In one particular embodiment, the oxygen containing gas supplied in the second etching gas mixture is $O_2$. It is noted that a small amount of the fluorine-carbon gas, such as fluorine-carbon gas from the first etching gas mixture, may be continuously supplied to assist removal residuals from the film stack 602. The oxygen containing gas in the second etching gas mixture is selected to react with the ruthenium (Ru) material by its nature of easy reaction with the ruthenium (Ru) material. The oxygen containing gas reacts with the ruthenium (Ru) material, forming ruthenium oxide (e.g., $Ru+O_2 \rightarrow RuO_4$) in volatile state which may be easily pumped out from the processing chamber 300. As the oxygen containing gas is an easily available processing precursor, utilization of ruthenium (Ru) material as the metal conductive layer $610b_1$ in the film stack 602 for forming three dimensional semiconductor chip devices may ease the overall manufacturing complexity while maintaining the desired electrical performance required for the chip devices. Furthermore, the oxygen containing gas supplied in the second etching gas mixture may also repair any pits, defects, dents or damaged profile from the upper first layer $608a_1$ so as to gently reconstruct the profile of the first layer $608a_1$ while gradually removing the ruthenium (Ru) material from the metal conductive layer $610b_1$ in the film stack 602.

Furthermore, as the ruthenium (Ru) material from the metal conductive layer $610b_1$ by its nature has different film properties from the dielectric material from the first layer $608a_1$, the ruthenium (Ru) material from the metal conductive layer $610b_1$ may then serve as a good barrier/etching stop layer that may prevent the structure from over-etching, which is often found in the conventional structure utilizing both dielectric layers in the film stack.

During etching, the process pressure may be maintained between about 1 mTorr and about 5000 mTorr. A RF source power may be controlled at between about 500 Watts and about 5000 Watts. A RF bias power may be controlled at between about 50 Watts and about 800 Watts. A substrate temperature may be maintained between about 25 degrees Celsius and about 500 degrees Celsius.

After a first cycle of the etching process supplying the first etching gas mixture and then the second etching gas mixture, a photoresist trimming process is performed. The photoresist trimming process is performed to reduce the first width 651 of the photoresist layer 614 to a second width 653, as indicated by an arrow 654 depicted in FIG. 6G. As the photoresist layer 614 as selected may have a substantially equal vertical trimming rate to a horizontal trimming rate, the width change of the photoresist layer 614 in the horizontal and the vertical directions may be substantially equal. By such selection of the photoresist layer 614 as used, thickness consumption of the photoresist layer 614 may be easily detected and calculated during the photoresist trimming process. After the trimming process, a surface 646 of the first layer $608a_1$ is then exposed, ready for a second cycle of the etching process to form another stair-like structure in the multi-material layer 604. The trimming process and the etching process at operation 508 may be in-situ performed in a single processing chamber using different chemistries.

Figure 6G:
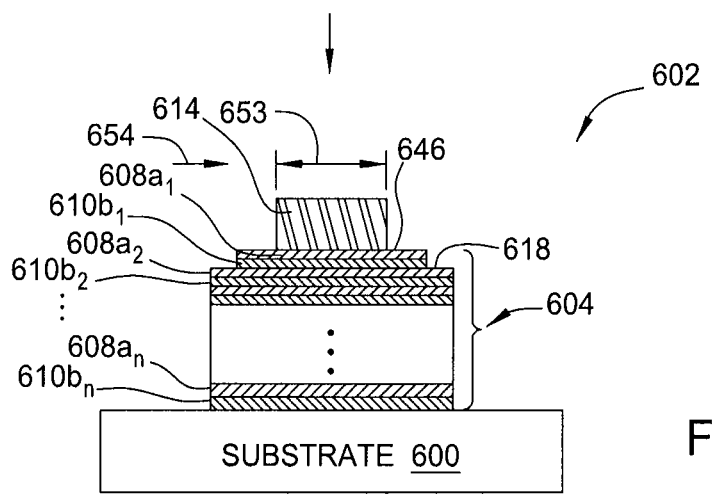
Figure 6H:
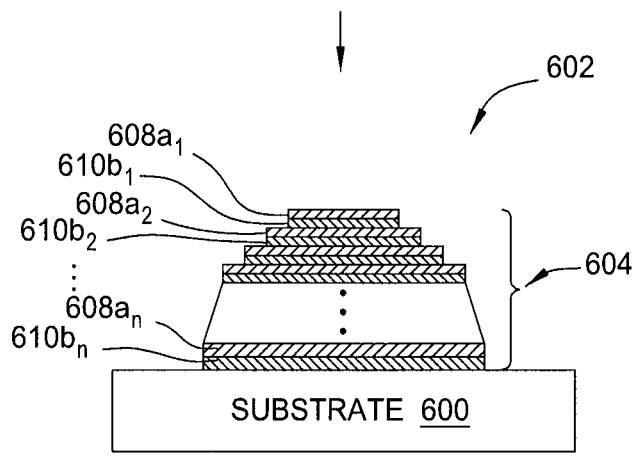

In one embodiment, the trimming gas mixture is supplied to trim the photoresist layer 614 to the second width 653 having a predetermined critical dimension. The trimming process is generally an isotropic trimming process. During trimming, the photoresist layer 614 is trimmed in both vertical direction and in the lateral (e.g., horizontal) direction before the trimmed photoresist layer 614 is utilized as the etch mask for the subsequent etching processes. As the dimension of the photoresist layer 614 may be further reduced during the subsequent etching process to more stair-like structure in the film stack 602, the film stack 602 may be repeatedly etched by cycles of the etching process including the first etching gas mixture and the second gas mixture until a desired number of the stair-like structure are formed in the multi-material layer 604, as shown in FIG. 6H.

The trimming gas mixture is selected to have a high selectivity for the photoresist layer 614 over the multi-material layer 604, thus predominantly trimming the photoresist layer 614 rather than etching the exposed first stair-like structure in the multi-material layer 604 and the exposed surface 646, 618 of the first layer $608a_1$, $608a_2$. In one embodiment, the trimming gas mixture includes, but not limited to, an oxygen containing gas accompanying by optional nitrogen containing gas and/or an inert gas. Examples of the oxygen containing gas include $O_2$, NO, $N_2O$, $CO_2$, CO and the like. Examples of the nitrogen containing gas includes $N_2$, NO, $N_2O$, $NH_3$ and the like. Alternatively, inert gas, such as Ar or He, may also be incorporated with the first trimming gas into the etch chamber.

Several process parameters are regulated while the trimming gas mixture supplied into the processing chamber. In one embodiment, the chamber pressure in the presence of the trimming gas mixture is regulated to a relatively high process pressure, such as greater than 25 mTorr, for example between about 30 mTorr to about 200 mTorr, for example, such as between about 33 mTorr and about 80 mTorr. The trimming gas mixture may include an oxygen gas flowed into the chamber at a rate between about 10 sccm to about 1000 sccm. The nitrogen containing gas may be supplied at a rate between about 20 sccm and about 200 sccm. In one example, the oxygen containing gas used in the trimming gas mixture is $O_2$ and the nitrogen containing gas used in the trimming gas is $N_2$. In an exemplary embodiment, the $O_2$ gas and $N_2$ gas is supplied in the trimming gas mixture at a $O_2:N_2$ ratio greater than about 5, such as between about 4:1 and about 10:1. A substrate temperature may be maintained between about 10 degrees Celsius to about 500 degrees Celsius, such as about 88 degrees Celsius.

RF source power may be applied to maintain a plasma formed from the trimming process gas. For example, a source power of about 500 Watts to about 5000 Watts, such as about 2500 Watts, may be applied to an inductively coupled antenna source to maintain a plasma inside the etch chamber. In one embodiment, a pulsed mode RF source power may be utilized during the trimming process. In one embodiment, the RF source power may be pulsed into the processing chamber 200 at a duty cycle between about 10 percent and about 90 percent.

It is noted that etching process and the trimming process at operation 508 may be repeatedly performed until a desired number of the stair-like structures are formed in the multi-material layer 604. Thus, after the trimming process, another etching process is performed to etch the first layer $608a_2$ and the metal conductive layer $610b_2$ to form a second stair-like structure using the trimmed photoresist layer 614, as shown in FIG. 6G, as an etching mask while further etching the first layer $608a_2$ through its exposed surface 646 to reduce its initial dimension to the width defined by the trimmed photoresist layer 614. By using this trimming process and etching process performed by method 500, symmetric stair-like structures with substantially symmetric widths at two sides of the stair-like structures may be obtained.

Thus, methods and apparatus for forming stair-like structures for manufacturing three dimensional (3D) stacking of semiconductor devices are provided. The methods and the apparatus may advantageously provide a film stack including a metal conductive material, such as a ruthenium containing material, in the film stack as well as a particular reacting precursor to etch the metal conductive material. By utilization of metal conductive material, such as a ruthenium containing material, in the film stack as well as a particular reacting precursor to etch the metal conductive material, an improved dimension and profile control of the resultant stair-like structures formed in a film stack may be obtained and the electrical performance of the chip devices may be enhanced in applications for three dimensional (3D) stacking of semiconductor devices.

While the foregoing is directed to embodiments of the present disclosure, other and further embodiments of the disclosure may be devised without departing from the basic scope thereof, and the scope thereof is determined by the claims that follow.

The invention claimed is:

1. A method of forming stair-like structures on a substrate comprises:
   forming a film stack including repeating layers of a dielectric layer and a ruthenium containing material; and
   etching the ruthenium containing material in the film stack exposed by a patterned photoresist layer utilizing a first etching gas mixture comprising an oxygen containing gas.

2. The method of claim 1, wherein etching the ruthenium containing material in the film stack further comprises:
   supplying a second etching gas mixture to etch the dielectric layer.

3. The method of claim 2, wherein supplying the second etching gas mixture further comprises:
   repeatedly supplying the first and the second etching gas mixture to cyclically etch the ruthenium containing material and the dielectric layer respectively.

4. The method of claim 3, further comprising:
   performing a trimming process to trim the patterned photoresist layer from a first dimension to a second dimension prior to repeating each cycle of the supplying of the first and the second etching gas mixture.

5. The method of claim 1, wherein the oxygen containing gas in the first etching gas mixture includes at least one of $O_3$, $O_2$, $H_2O$, NO, $NO_2$, $N_2O$, CO and $CO_2$.

6. The method of claim 1, wherein the first etching gas mixture further comprises a fluorine-carbon gas.

7. The method of claim 1, wherein the dielectric layer is a silicon oxide layer.

8. The method of claim 4, further comprising:
   forming stair-like structures in the film stack after a number of cycles of performing the trimming process.

9. The method of claim 8, wherein the stair-like structure in the film stack is utilized to form three dimension NAND memory devices.

10. A method of forming stair-like structures on a substrate comprises:
    forming a film stack including alternating first and second layers;
    selectively removing the second layers from the film stack, leaving spaces between the first layers;
    forming metal conductive layers comprising a ruthenium containing material in the spaces and in contact with the first layers; and
    etching the metal conductive layers in the film stack exposed by a patterned photoresist layer utilizing a first etching gas mixture comprising oxygen containing gas.

11. The method of claim 10, wherein the first and the second layers are dielectric layers.

12. The method of claim 10, wherein the first layers are silicon oxide layers.

13. The method of claim 10, wherein the oxygen containing gas in the first etching gas mixture includes at least one of $O_3$, $O_2$, $H_2O$, NO, $NO_2$, $N_2O$, CO and $CO_2$.

14. The method of claim 10, wherein the first etching gas mixture further comprises a fluorine-carbon gas.

15. The method of claim 10 further comprising:
supplying a second etching gas mixture to etch the first layers disposed in the film stack.

16. The method of claim 10, wherein the first layers and the metal conductive layers are etched in a single processing chamber.

17. The method of claim 15 further comprising:
forming stair-like structures in the film stack after cyclically supplying the first and the second etching gas mixture.

18. The method of claim 17, wherein the stair-like structure in the film stack is utilized to form three dimension NAND memory devices.

19. A method of forming stair-like structures on a substrate comprises:
forming a film stack including alternating dielectric layers and ruthenium containing layers;
etching the ruthenium containing layers in the film stack exposed by a patterned photoresist layer utilizing a first etching gas mixture comprising oxygen containing gas until a first surface of the dielectric layers is exposed;
trimming the patterned photoresist layer from a first dimension to a second dimension until a second surface of the dielectric layers is exposed; and
etching the dielectric layers from the second surface exposed by the trimmed patterned photoresist layer by a second etching gas mixture.

* * * * *